(12) United States Patent
Goto et al.

(10) Patent No.: US 10,483,942 B2
(45) Date of Patent: Nov. 19, 2019

(54) ACOUSTIC WAVE DEVICE WITH ACOUSTICALLY SEPARATED MULTI-CHANNEL FEEDBACK

(71) Applicant: Skyworks Solutions, Inc., Woburn, MA (US)

(72) Inventors: Rei Goto, Osaka (JP); Toru Yamaji, Nagaokakyou (JP)

(73) Assignee: Skyworks Solutions, Inc., Woburn, MA (US)

( * ) Notice: Subject to any disclaimer, the term of this patent is extended or adjusted under 35 U.S.C. 154(b) by 60 days.

(21) Appl. No.: 15/874,700

(22) Filed: Jan. 18, 2018

(65) Prior Publication Data

US 2018/0262179 A1 Sep. 13, 2018

Related U.S. Application Data

(60) Provisional application No. 62/450,029, filed on Jan. 24, 2017, provisional application No. 62/475,424, filed on Mar. 23, 2017.

(51) Int. Cl.
*H03H 9/02* (2006.01)
*H03H 9/25* (2006.01)
*H03H 9/64* (2006.01)
*H03H 9/72* (2006.01)
*H03H 9/145* (2006.01)

(52) U.S. Cl.
CPC .... *H03H 9/02818* (2013.01); *H03H 9/14552* (2013.01); *H03H 9/25* (2013.01); *H03H 9/6483* (2013.01); *H03H 9/6489* (2013.01); *H03H 9/725* (2013.01)

(58) Field of Classification Search
CPC .. H03H 9/02818; H03H 9/6489; H03H 9/725; H03H 9/6483; H03H 9/25; H03H 9/14552
USPC .......................................... 333/133, 193–196
See application file for complete search history.

(56) References Cited

U.S. PATENT DOCUMENTS

| | | |
|---|---|---|
| 5,508,667 A | 4/1996 | Kondratiev et al. |
| 7,733,196 B2 | 6/2010 | Tsurunari et al. |
| 8,174,339 B2 | 5/2012 | Matsuda et al. |
| 8,228,137 B2 | 7/2012 | Inoue et al. |
| 8,378,760 B2 | 2/2013 | Iwaki et al. |
| 9,118,303 B2 | 8/2015 | Inoue |
| 9,219,467 B2 | 12/2015 | Inoue et al. |
| 9,246,533 B2 | 1/2016 | Fujiwara et al. |
| 9,520,857 B2 | 12/2016 | Fujiwara et al. |
| 9,722,573 B2 | 8/2017 | Fujiwara et al. |
| 2006/0197630 A1* | 9/2006 | Fuse ................ H03H 9/0576 333/133 |
| 2011/0254639 A1 | 10/2011 | Tsutsumi et al. |
| 2013/0113576 A1 | 5/2013 | Inoue et al. |
| 2014/0113571 A1 | 4/2014 | Fujiwara et al. |

(Continued)

*Primary Examiner* — Robert J Pascal
*Assistant Examiner* — Jorge L Salazar, Jr.
(74) *Attorney, Agent, or Firm* — Knobbe, Martens, Olson & Bear, LLP

(57) ABSTRACT

Aspects of this disclosure relate to an acoustic wave device that includes an acoustic obstacle disposed between canceling circuits coupled to one or more acoustic wave filters. The canceling circuits can cancel frequency components within different frequency bands. The acoustic obstacle can reduce acoustic coupling between the canceling circuits by scattering and/or absorbing acoustic energy.

20 Claims, 13 Drawing Sheets

(56) References Cited

U.S. PATENT DOCUMENTS

| | | |
|---|---|---|
| 2016/0172573 A1* | 6/2016 | Iwaki ................ H03H 9/02228 |
| | | 333/187 |
| 2016/0268997 A1 | 9/2016 | Komatsu et al. |
| 2017/0099043 A1 | 4/2017 | Goto et al. |
| 2017/0288627 A1 | 10/2017 | Takano et al. |
| 2017/0331456 A1 | 11/2017 | Ono |
| 2018/0069529 A1 | 3/2018 | Bi et al. |
| 2018/0152191 A1 | 5/2018 | Niwa et al. |

* cited by examiner

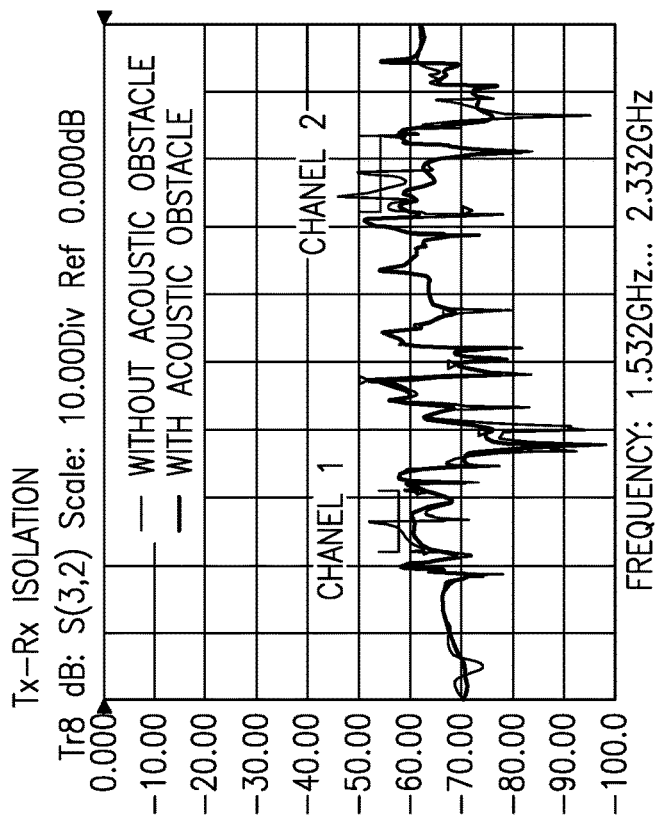
FIG.1C
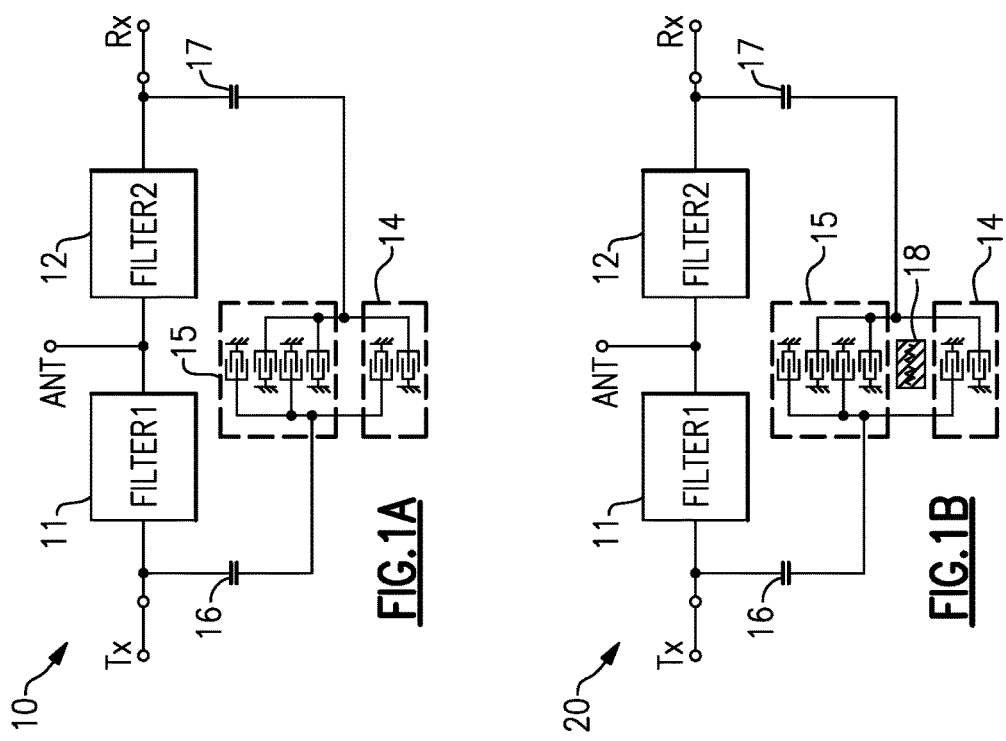
FIG.1A
FIG.1B

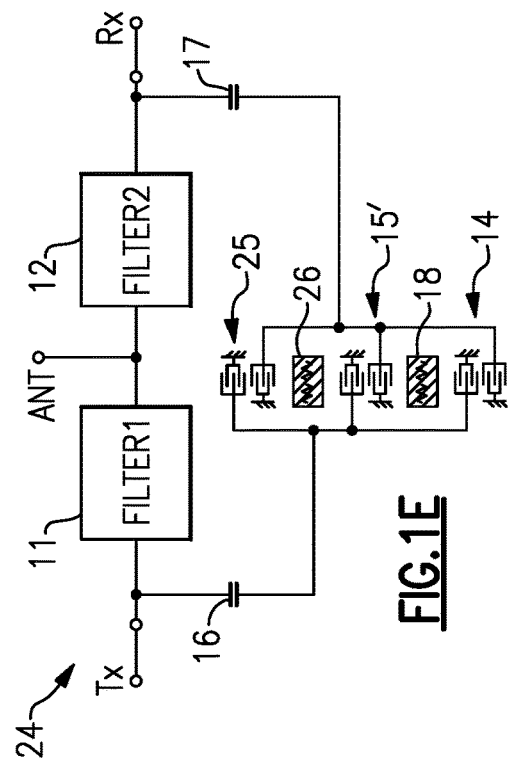
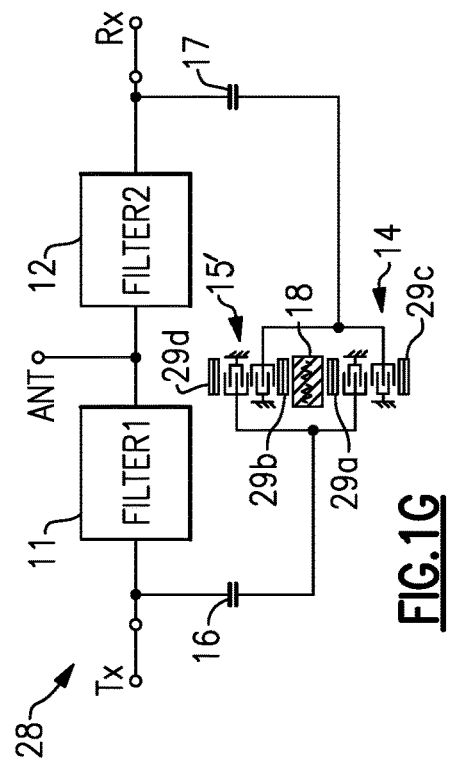
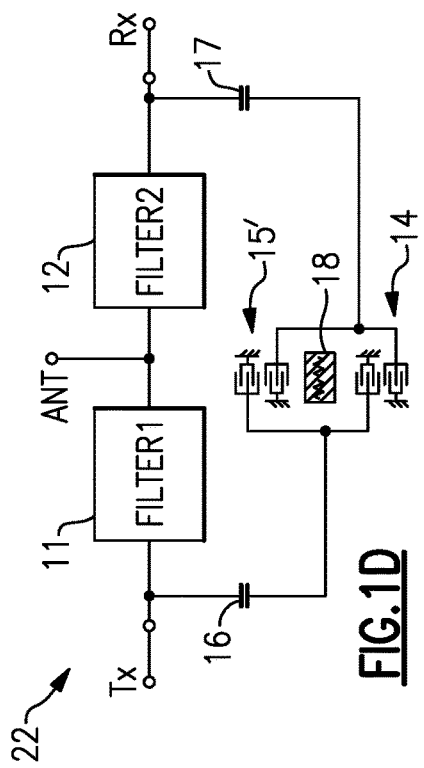
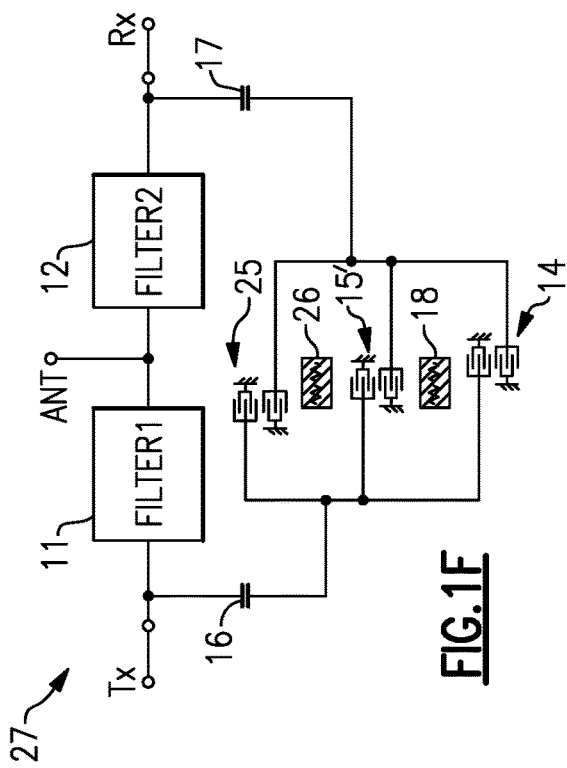
FIG.1D
FIG.1E
FIG.1F
FIG.1G

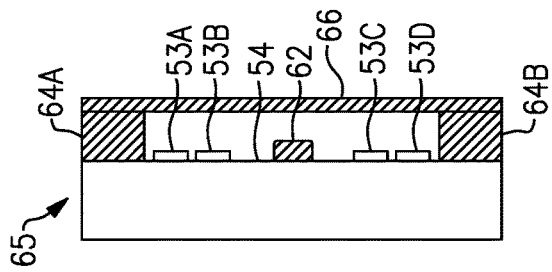
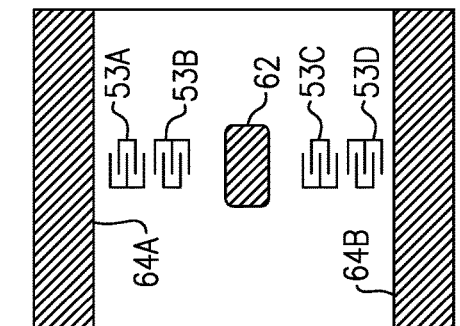
FIG.2B
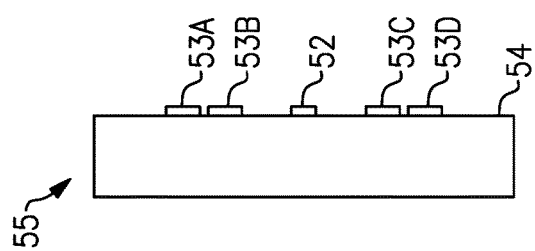
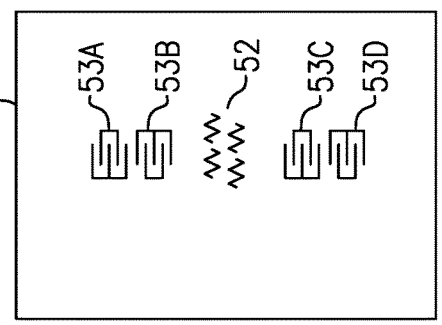
FIG.2A
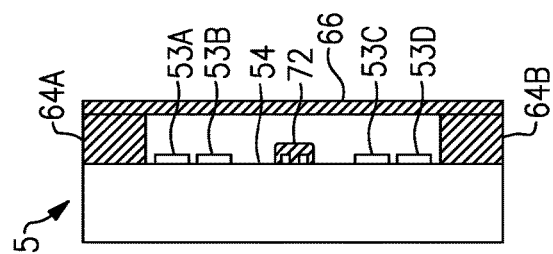
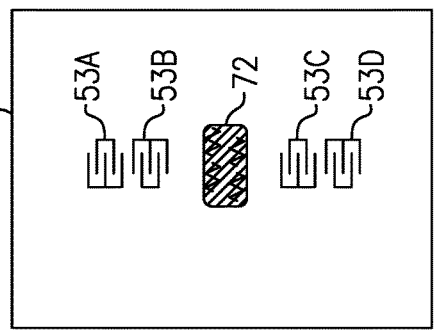
FIG.2C

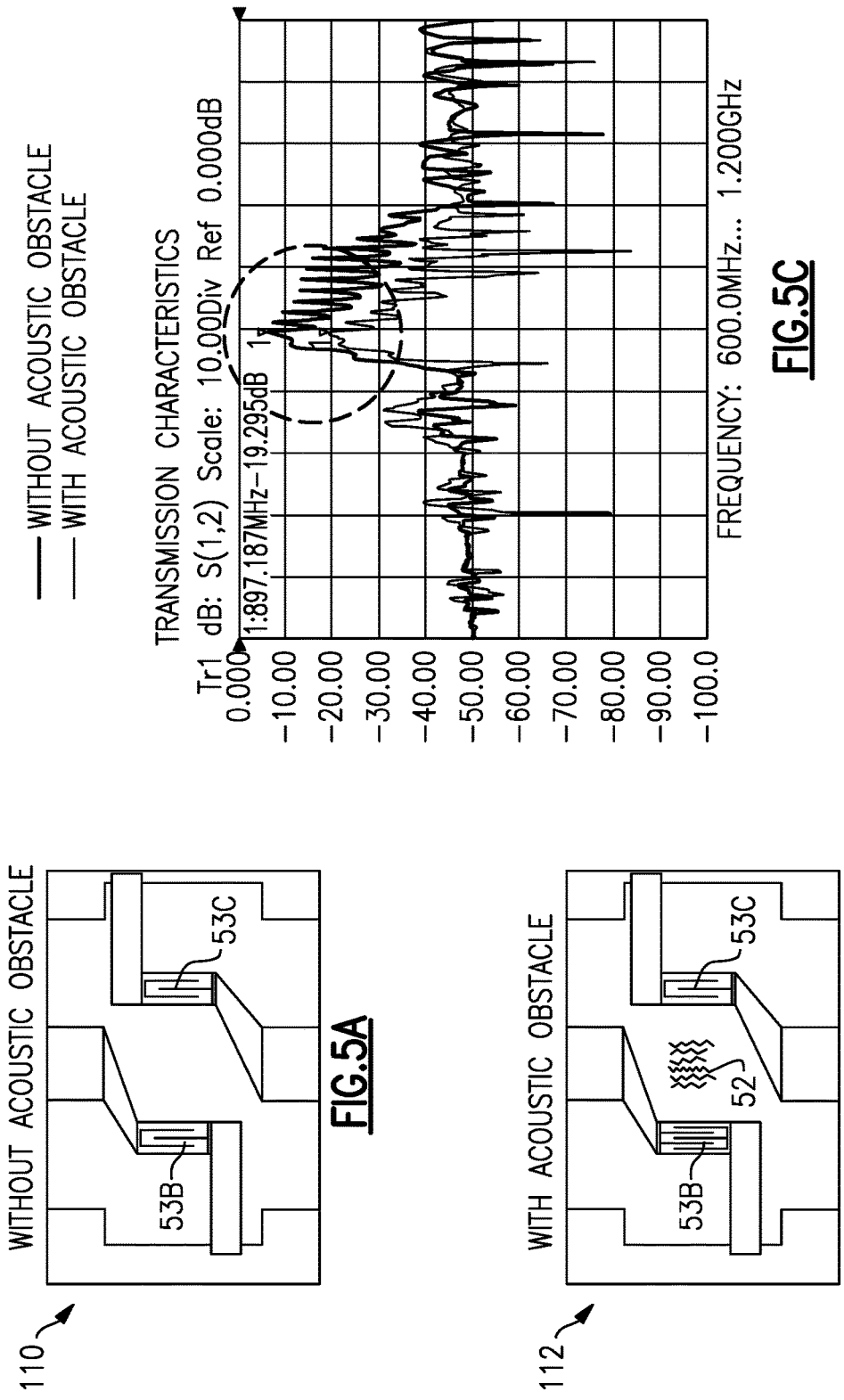

ACOUSTIC WAVE DEVICE WITH ACOUSTICALLY SEPARATED MULTI-CHANNEL FEEDBACK

CROSS REFERENCE TO PRIORITY APPLICATIONS

Any and all applications for which a foreign or domestic priority claim is identified in the Application Data Sheet as filed with the present application are hereby incorporated by reference under 37 CFR § 1.57. This application claims the benefit of priority under 35 U.S.C. § 119(e) of U.S. Provisional Patent Application No. 62/450,029, filed Jan. 24, 2017 and titled "ACOUSTIC WAVE DEVICE WITH ACOUSTICALLY SEPARATED MULTI-CHANNEL FEEDBACK," the disclosure of which is hereby incorporated by reference in its entirety herein. This application claims the benefit of priority under 35 U.S.C. § 119(e) of U.S. Provisional Patent Application No. 62/475,424, filed Mar. 23, 2017 and titled "ACOUSTIC WAVE DEVICE WITH ACOUSTICALLY SEPARATED MULTI-CHANNEL FEEDBACK," the disclosure of which is hereby incorporated by reference in its entirety herein.

BACKGROUND

Technical Field

Embodiments of this disclosure relate to acoustic wave filters.

Description of Related Technology

An acoustic wave filter can include a plurality of resonators arranged to filter a radio frequency signal. Example acoustic wave filters include surface acoustic wave (SAW) filters and bulk acoustic wave (BAW) filters. A film bulk acoustic resonator (FBAR) filter is an example of a BAW filter.

Acoustic wave filters can be implemented in radio frequency electronic systems. For instance, filters in a radio frequency front end of a mobile phone can include acoustic wave filters. Two acoustic wave filters can be arranged as a duplexer.

BRIEF DESCRIPTION OF THE DRAWINGS

Embodiments of this disclosure will now be described, by way of non-limiting example, with reference to the accompanying drawings.

FIG. 1A is a schematic diagram of an acoustic wave device that includes a duplexer and a feedback circuit.

FIG. 1B is a schematic diagram of an acoustic wave device that includes a duplexer and a feedback circuit with acoustically separated multi-channel feedback according to an embodiment.

FIG. 1C is a graph of transmit-receive isolation for the duplexers of FIGS. 1A and 1B.

FIG. 1D is a schematic diagram of an acoustic wave device that includes a feedback circuit with acoustically separated multi-channel feedback according to an embodiment.

FIG. 1E is a schematic diagram of an acoustic wave device that includes a feedback circuit with acoustically separated multi-channel feedback according to an embodiment.

FIG. 1F is a schematic diagram of an acoustic wave device that includes a feedback circuit with acoustically separated multi-channel feedback according to an embodiment.

FIG. 1G is a schematic diagram of an acoustic wave device that includes a feedback circuit with acoustically separated multi-channel feedback according to an embodiment.

FIG. 2A illustrates views of an acoustic wave device according to an embodiment.

FIG. 2B illustrates views of another acoustic wave device according to an embodiment.

FIG. 2C illustrates views of another acoustic wave device according to an embodiment.

FIG. 5A illustrates a portion of an acoustic wave device with interdigital transducers (IDTs) of different canceling circuits without an acoustic obstacle disposed therebetween.

FIG. 5B illustrates a portion of an acoustic wave device with an acoustic obstacle disposed between IDTs of different canceling circuits. FIG. 5C is a graph corresponding to the acoustic wave devices of FIGS. 5A and 5B.

SUMMARY OF CERTAIN INVENTIVE ASPECTS

Figure 1H:
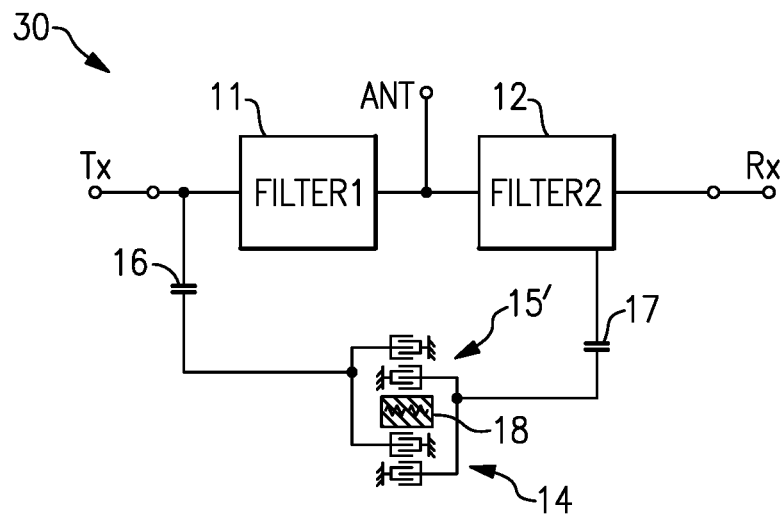
FIG. 1H is a schematic diagram of an acoustic wave device that includes a feedback circuit with acoustically separated multi-channel feedback according to an embodiment.
Figure 1I:
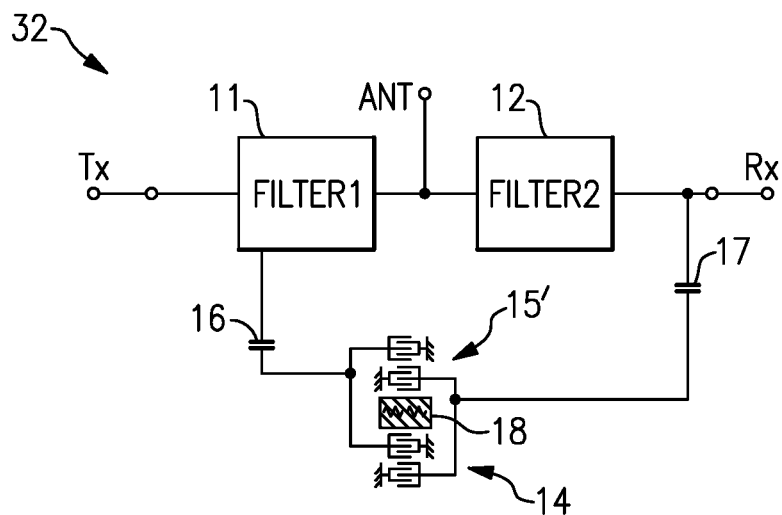
FIG. 1I is a schematic diagram of an acoustic wave device that includes a feedback circuit with acoustically separated multi-channel feedback according to an embodiment.

The innovations described in the claims each have several features, no single one of which is solely responsible for its desirable attributes. Without limiting the scope of the claims, some prominent features of this disclosure will now be briefly described.

One aspect of this disclosure is an acoustic wave device that includes a first canceling circuit, a second canceling circuit, an acoustic wave filter, and an acoustic obstacle. The first canceling circuit is arranged to cancel frequency components in a first frequency band. The second canceling circuit is arranged to cancel frequency components within a second frequency band. The acoustic wave filter is coupled to the first canceling circuit and the second canceling circuit. The acoustic obstacle is disposed between the first canceling circuit and the second canceling circuit.

The acoustic obstacle can be arranged to absorb acoustic energy. The acoustic obstacle can include a polymer. The acoustic wave device can include a cavity wall including the same polymer as the acoustic obstacle.

The acoustic obstacle can be arranged to scatter acoustic energy. The acoustic wave filter can include a surface acoustic wave resonator and the first canceling circuit can include an interdigital transducer electrode. The acoustic obstacle and the interdigital transducer electrode can each include the same material. The acoustic obstacle can have a zig-zag shape. The acoustic obstacle can to absorb acoustic energy and to scatter acoustic energy in certain embodiments.

The acoustic wave device can include a second acoustic wave filter coupled to the first canceling circuit and the second canceling circuit. The first acoustic wave filter can be a transmit filter and the second acoustic wave filter can be a receive filter. The first canceling circuit can attenuate a transmission characteristic of the receive filter at frequencies in a pass band of the transmit filter. The first acoustic wave filter and the second acoustic wave filter can be coupled to each other at a common antenna node. The first acoustic wave filter and the second acoustic wave filter can be included in a duplexer.

Another aspect of this disclosure is a multiplexer that includes a transmit filter, a receive filter, a first canceling circuit, a second canceling circuit, and an acoustic obstacle. The transmit filter includes first acoustic wave resonators. The receive filter includes second acoustic wave resonators. The receive filter and the transmit filter are coupled to each other at a common node. The first canceling circuit is coupled to the transmit filter and to the receive filter. The second canceling circuit is coupled to the transmit filter and to the receive filter. The acoustic obstacle is disposed between the first canceling circuit and the second canceling circuit.

The first canceling circuit can attenuate a transmission characteristic of the receive filter at frequencies in a pass band of the transmit filter. The first canceling circuit and the second canceling circuit can cancel frequency components of different carriers of a carrier aggregation signal. The second canceling circuit can attenuate a transmission characteristic of the transmit filter at frequencies in a pass band of the receive filter.

The multiplexer can be a duplexer. The common node can be an antenna node of the multiplexer.

The acoustic obstacle can be arranged to absorb acoustic energy. Alternatively or additionally, the acoustic obstacle can be arranged to scatter acoustic energy.

The first canceling circuit can include an interdigital transducer electrode. The acoustic obstacle and the interdigital transducer electrode can each include the same material.

Another aspect of this disclosure is a surface acoustic wave device that includes a surface acoustic wave filter and a multi-channel feedback circuit coupled to the surface acoustic wave filter. The multi-channel feedback circuit includes first interdigital transducer electrodes corresponding to a first channel, second interdigital transducer electrodes corresponding to a second channel, and an acoustic obstacle arranged to reduce acoustic coupling between the first interdigital transducer electrodes and the second interdigital transducer electrodes.

The surface acoustic wave device can include a cavity wall. The acoustic obstacle can include the same material as the cavity wall.

The acoustic obstacle and the first interdigital transducer electrodes both include the same material. In some instances, the acoustic obstacle can also include a polymer.

The acoustic obstacle can absorb acoustic energy. Alternatively or additionally, the acoustic obstacle can scatter energy.

The surface acoustic wave device can further include a second surface acoustic wave filter coupled to the multi-channel feedback circuit. The first acoustic wave device can be a transmit filter and the second acoustic wave device can be a receive filter. The first acoustic wave filter and the second acoustic wave filter can be coupled to each other at a common node. The first acoustic wave filter and the second acoustic wave filter can be included in a duplexer. The first acoustic wave filter can be arranged to filter radio frequency signals.

In some instances, the first channel and the second channel can correspond to different respective carriers of a carrier aggregation signal. In some instances, the first channel can correspond to a transmit channel and the second channel can correspond to a receive channel.

Another aspect of this disclosure is a method of manufacturing an acoustic wave device. The method includes forming an acoustic obstacle between canceling circuits coupled to an acoustic wave filter such that the acoustic obstacle is arranged to reduce acoustic coupling between the canceling circuits. The canceling circuits are associated with different frequency bands.

The acoustic wave device can be a surface acoustic wave device. The canceling circuits can include interdigital transducer electrodes. Forming the acoustic obstacle can include patterning the same material as the interdigital transducer electrodes during a processing operation to form the interdigital transducer electrodes.

The acoustic obstacle can include a polymer. The polymer of can be formed while a cavity wall of the acoustic wave device is being formed of the same polymer.

The method can include electrically connecting the canceling circuits to the acoustic wave filter and a second acoustic wave filter. The frequency band can correspond to a pass band of the second acoustic wave filter. The method can include arranging the first acoustic wave filter and the second acoustic wave filter as a duplexer.

Another aspect of this disclosure is a method of filtering a radio frequency signal. The method includes providing, using an acoustic obstacle, acoustic separation between a canceling circuit and another canceling circuit positioned in proximity to the canceling circuit; applying a signal to an acoustic wave filter using the canceling circuit so as to attenuate a transmission characteristic of the acoustic wave filter within a frequency band outside the pass band of the acoustic wave filter; and filtering a radio frequency signal with the acoustic wave filter with the attenuated transmission characteristic.

DETAILED DESCRIPTION OF CERTAIN EMBODIMENTS

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Some mobile applications are specifying for filters and/or duplexers to achieve higher rejection performance in several rejection frequency bands. To achieve relatively high rejection, a feedback circuit can be implemented. A feedback circuit can include interdigital transducers (IDTs) and transmission lines. The interdigital transducers can control magnitude and phase of a signal. Transmission lines can be connected to a main filter circuit to cancel a portion of the main filter response.

To avoid the communication between IDTs of feedback circuits, such IDTs can be implemented with physical layouts that are relatively far away from each other. However, the desire to minimize a filter die size can restrict options for designers to physically lay out IDTs of feedback circuits. In some instances, it is not possible to have IDTs of different feedback circuits with physical layouts sufficiently far away from each other to avoid communication between the IDTs of the different feedback circuits. Aspects of this disclosure relate to including an acoustic obstacle between IDTs of different feedback circuits to prevent acoustic communication between the IDTs of different feedback circuits. This can allow designers more flexibility in the physical layout of the feedback circuits.

To improve multi-frequency band rejection, several IDTs of feedback circuits for each rejection band can be implemented. IDTs of different feedback circuits can communicate with each other by acoustic coupling. Accordingly, an unwanted response can be excited and degrade the rejection performance of a filter. To overcome this problem, an acoustic obstacle can be positioned between IDTs of different feedback circuits for different rejection bands. The acoustic obstacle can be made of the same material as an IDT. Alternatively or additionally, the acoustic obstacle can include a polymer. The same polymer material can form an air cavity of an acoustic wave filter and/or a duplexer. The acoustic obstacle can be formed as part of a front end process and/or a back end process.

Acoustic obstacles can be disposed between different canceling circuits arranged to cancel frequency components within different frequency bands. Such acoustic obstacles can be implemented in an acoustic wave device that includes an acoustic wave filter coupled to the canceling circuits. The acoustic wave filter can be a surface acoustic wave filter. In some embodiments, the different canceling circuits can be coupled to both a transmit filter that includes first acoustic wave resonators and a receive filter that includes second acoustic wave resonators, in which the transmit filter and the receive filter are coupled to each other at a common node. According to certain embodiments, a surface acoustic wave device includes a surface acoustic wave filter, a multi-channel feedback circuit coupled to the surface acoustic wave filter, and an acoustic obstacle disposed between interdigital transducer electrodes of the multi-channel feedback circuit.

FIG. 1A is a schematic diagram of an acoustic wave device 10 that includes a first filter 11, a second filter 12, and a multi-channel feedback circuit. The acoustic wave device 10 of FIG. 1A is arranged as a duplexer having a transmit port Tx, a receive port Rx, and an antenna port ANT. While embodiments discussed herein may relate to duplexers, any suitable principle and advantages discussed herein can be applied to other types of multiplexers, such as quadplexers, hexaplexers, etc. Moreover, any suitable principle and advantages can be implemented in association with a single filter and/or a plurality of filters.

As illustrated in FIG. 1A, the multi-channel feedback circuit includes a first canceling circuit 14 and a second canceling circuit 15. These canceling circuits can cancel frequency components within different frequency bands or channels. The first canceling circuit 14 and the second canceling circuit 15 of FIG. 1A can communicate with each other by acoustic coupling. This can result in an unwanted frequency response that degrades the rejection performance of the first filter 11 and/or the second filter 12.

FIG. 1B is a schematic diagram of an acoustic wave device 20 according to an embodiment. The acoustic wave device 20 of FIG. 1A is arranged as a duplexer. The acoustic wave device 20 includes a multi-channel feedback circuit with acoustically separated multi-channel feedback. The acoustic wave device 20 is like the acoustic wave device 10 of FIG. 1A, except that an acoustic obstacle 18 is also included in the acoustic wave device 20 of FIG. 1B. As shown in FIG. 1B, an acoustic obstacle 18 can be disposed between the first canceling circuit 14 and the second canceling circuit 15. The acoustic obstacle 18 can include a metal pattern, a cavity pillar, a silicon dioxide grove, any other suitable obstacle, or any suitable combination thereof. The acoustic obstacle 18 can reduce and/or eliminate acoustic coupling between the first canceling circuit 14 and the second canceling circuit 15. The acoustic obstacle 18 can absorb and/or scatter acoustic energy.

As illustrated in FIG. 1B, the first canceling circuit 14 and the second canceling circuit 15 are both coupled to the first filter 11. Similarly, the first canceling circuit 14 and the second canceling circuit 15 are both coupled to the second filter 12 in FIG. 1B. The canceling circuits 14 and 15 can cancel signal components in respective frequency bands by reducing and/or eliminating such signal components. The canceling circuits 14 and 15 can each apply a signal having an opposite phase as an unwanted signal component to reduce and/or eliminate the effect of such an unwanted signal component. These canceling circuits can cancel frequency components within different frequency bands or channels. For instance, the first canceling circuit 14 can cancel frequency components within a first channel and the second canceling circuit 15 can cancel frequency components within a second channel, in which the first channel and second channel are different frequency bands. This can provide higher rejection in the first channel and the second channel.

The first channel can correspond to a lower rejection band and the second channel can correspond to a higher rejection band. In some instances, the first channel and the second channel can be associated with different carriers of a carrier aggregation signal. The first canceling circuit 14 and the second canceling circuit 15 can cancel frequency components in different bands of the second filter 12 in certain instances. The first canceling circuit 14 and the second canceling circuit 15 can cancel frequency components in different bands of the first filter 11 in certain instances.

According to some instances, the first canceling circuit 14 can cancel frequency within the first channel in the frequency response of the second filter 12 and the second canceling circuit 15 can cancel frequency components within the second channel in the frequency response of the first filter 11. In an example, the first channel can correspond to a transmit channel and the first canceling circuit 14 can cancel noise associated with the first channel in the response of the second filter 12. Accordingly, the first canceling circuit 14 can attenuate a transmission characteristic of the receive filter 12 at frequencies in a pass band of the transmit filter 11. In some such instances, the second channel can correspond to a receive channel and the second canceling circuit 15 can cancel noise associated with the second channel in the response of the first filter 11. Accordingly, the second canceling circuit 15 can attenuate a transmission characteristic of the transmit filter 11 at frequencies in a pass band of the receive filter 12.

The canceling circuits 14 and 15 can include interdigital transducer electrodes as illustrated. In such canceling circuits, the IDT electrodes can apply a signal having approximately the same amplitude and an opposite phase to a signal component to be canceled. In some other instances, the first canceling circuit and/or the second canceling circuit can include bulk acoustic wave element(s) and/or an LC circuit. As shown in FIG. 1B, the IDTs of the canceling circuits 14 and 15 can be coupled to the first filter 11 by way of a first capacitor 16 and other IDTs of the canceling circuits 14 and 15 can be coupled to the second filter 12 by way of a second capacitor 17. Any suitable principles and advantages of an acoustically separated multi-channel feedback circuit discussed herein can be implemented in association with a multi-channel feedback circuit arranged in parallel with a filter. The first canceling circuit 14 and/or the second canceling circuit 15 can be implemented in accordance with any suitable principles and advantages described in U.S. Pat. No. 9,246,533 and/or U.S. Pat. No. 9,520,857, the disclosures of these patents are hereby incorporated by reference in their entireties herein.

The first filter 11 is arranged to filter a radio frequency signal. A radio frequency signal can have a frequency in a range from 30 kHz to 300 GHz, such as in a range from about 450 MHz to 6 GHz. The first filter 11 can include acoustic wave resonators. For instance, the first filter can include surface acoustic wave resonators. As another example, the first filter can alternatively or additionally include one or more BAW resonators, such as FBARs. The first filter 11 can be a ladder filter that includes series acoustic wave resonators and shunt acoustic wave resonators. As illustrated, the first filter 11 is a transmit filter. The illustrated second filter 12 is a receive filter. The second filter 12 can be implemented in accordance with any suitable principles and advantages discussed with reference to the first filter 11.

FIG. 1C is a graph of transmit-receive isolation for the duplexers of FIGS. 1A and 1B. FIG. 1C indicates that the acoustic obstacle 18 of FIG. 1B improves rejection in channel 1 and also improves rejection in channel 2.

FIGS. 1D to 1K are schematic diagrams of acoustic wave devices that include an acoustic obstacle between canceling circuits for different frequency bands according to certain embodiments. Any suitable principles and advantages of these acoustic wave devices can be implemented with each other and/or with the acoustic wave device of FIG. 1B.

FIG. 1D is a schematic diagram of an acoustic wave device 22 that includes a feedback circuit with acoustically separated multi-channel feedback according to an embodiment. As shown in FIG. 1D, the second canceling circuit 15' can include fewer IDT electrodes than the second canceling circuit 15 illustrated in FIG. 1B. More generally, any of the canceling circuits of a multi-channel feedback circuit can include any suitable number of IDT electrodes.

FIG. 1E is a schematic diagram of an acoustic wave device 24 that includes a feedback circuit with acoustically separated multi-channel feedback according to an embodiment. FIG. 1E illustrates that more than one acoustic obstacle can be included between canceling circuits of a multi-channel feedback circuit. As shown in FIG. 1E, the multi-channel feedback circuit includes a first canceling circuit 14, a second canceling circuit 15', and a third canceling circuit 25. A first acoustic obstacle 18 is disposed between the first canceling circuit 14 and the second canceling circuit 15'. A second acoustic obstacle 26 is disposed between the second canceling circuit 15' and the third canceling circuit 25. FIG. 1E also illustrates that more than two canceling circuits can be implemented in a multi-channel feedback circuit. Accordingly, in certain embodiments, a multi-channel feedback circuit can include three or more canceling circuits and two or more acoustic obstacles.

FIG. 1F is a schematic diagram of an acoustic wave device 27 that includes a feedback circuit with acoustically separated multi-channel feedback according to an embodiment. FIG. 1F illustrates that positions of the canceling circuits of a multi-channel feedback circuit can be offset from each other. As shown in FIG. 1F, the first canceling circuit 14 is offset from the third canceling circuit 25. This schematic representation of canceling circuits being offset from each other can correspond to physical offsets in layout of IDTs of the canceling circuits. Offsetting IDT tracks of different canceling circuits from each other combined with including an acoustic obstacle between the different canceling circuits can reduce acoustic coupling between IDTs of the canceling circuits and improve performance of the canceling circuits.

FIG. 1G is a schematic diagram of an acoustic wave device 28 that includes a feedback circuit with acoustically separated multi-channel feedback according to an embodiment. FIG. 1G illustrates that IDTs of a canceling circuit can be disposed between reflective gratings. As illustrated, a reflective grating 29a is disposed between an IDT of the first canceling circuit 14 and the acoustic obstacle 18. Similarly, a reflective grating 29b can be disposed between an IDT of the second canceling circuit 15' and the acoustic obstacle 18. The first canceling circuit 14 is disposed between reflective gratings 29a and 29c in FIG. 1G. Similarly, the second canceling circuit 15' can be disposed between reflective gratings 29b and 29d.

While multi-channel feedback circuits can be coupled between a transmit port and a receive port of a duplexer, a multi-channel feedback circuit can be coupled to filter at a different point than a transmit port or a receive port. For instance, a multi-channel feedback circuit can be coupled to a node between two series resonators in an acoustic wave filter. In the acoustic wave device 30 of FIG. 1H, a multi-channel feedback circuit is coupled to the second filter 12 at a node between the receive port Rx and the antenna port ANT. In the acoustic wave device 32 of FIG. 1I, a multi-channel feedback circuit is coupled to the first filter 11 at a node between the transmit port Tx and the antenna port ANT. In other instances, a multi-channel feedback circuit can be coupled to the first filter 11 at a node between the transmit port Tx and the antenna port ANT and also coupled to the second filter 12 at a node between the receive port Tx and the antenna port ANT.

Figure 1J:
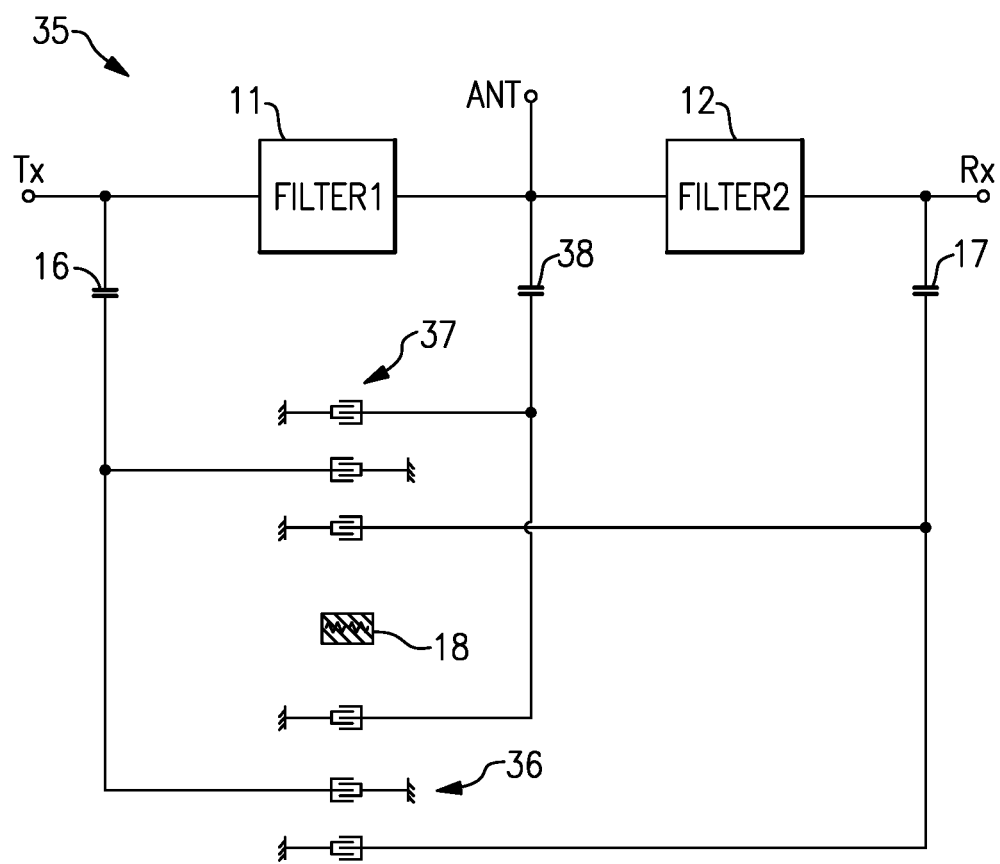
FIG. 1J is a schematic diagram of an acoustic wave device that includes a feedback circuit coupled to more than two nodes of the acoustic wave device according to an embodiment.

In some embodiments, a multi-channel feedback circuit can receive feedback from more than two nodes in an electronic system. FIG. 1J is a schematic diagram of an acoustic wave device 35 that includes a multi-channel feedback circuit coupled to more than two nodes of the acoustic wave device 35 according to an embodiment. The illustrated multi-channel feedback circuit includes a first canceling circuit 36 and a second canceling circuit 37. Each of these canceling circuits is coupled to a transmit port Tx, a receive port Rx, and an antenna port ANT. The first canceling circuit 36 is similar to the first canceling circuit 14 discussed above except that an additional IDT electrode is coupled to the antenna port ANT by way of a capacitor 38. The canceling circuit 36 can operate as a Double Mode SAW filter. The second canceling circuit 37 is similar to the second canceling circuit 15' discussed above except that an additional IDT electrode is coupled to the antenna port ANT by way of a capacitor 38. The canceling circuit 37 can operate as a Double Mode SAW filter. The illustrated acoustic obstacle 18 is disposed between the first canceling circuit 36 and the second canceling circuit 37 to absorb and/or scatter acoustic energy.

Figure 1K:
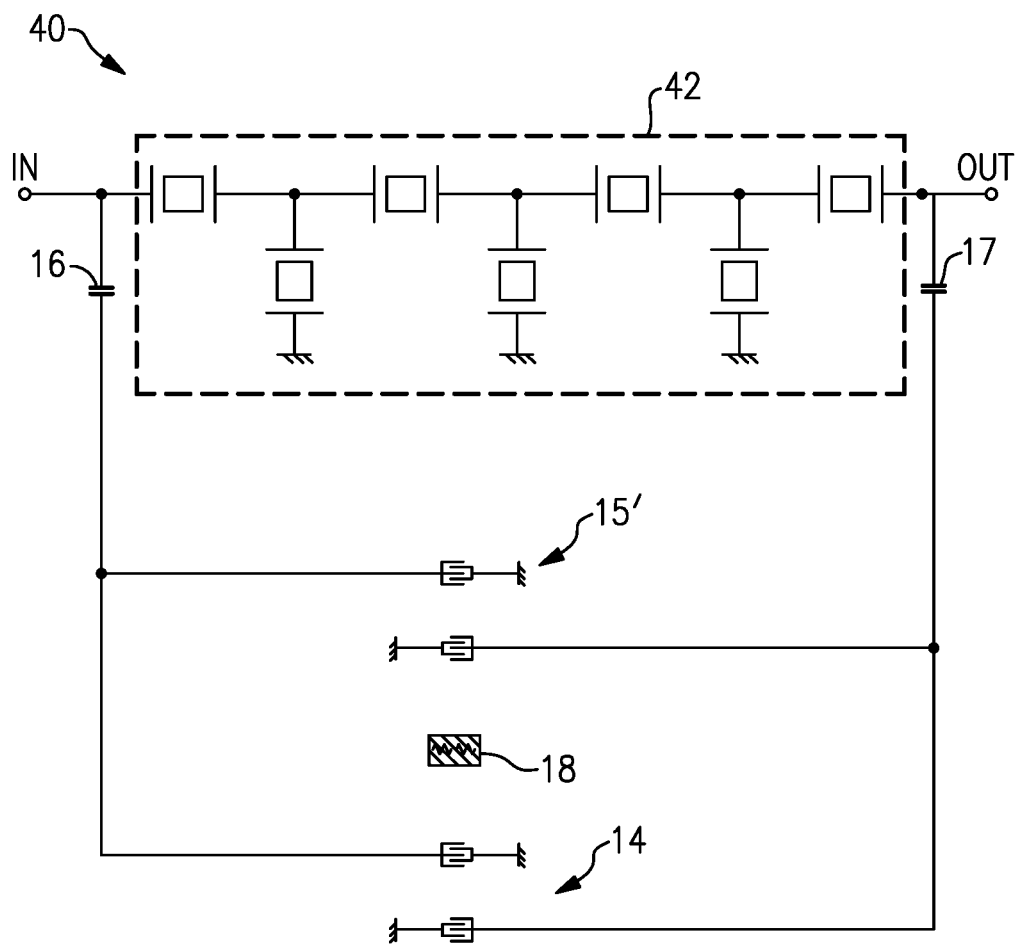
FIG. 1K is a schematic diagram of an acoustic wave device that includes a feedback circuit coupled in parallel with a filter according to an embodiment.

Although various multi-channel feedback circuits discussed herein are coupled between a transmit port and a receive port of a duplexer, any suitable principles and advantages discussed herein can be implemented in other contexts. For instance, a multi-channel feedback circuit can be coupled between two nodes of a filter. As an example, a multi-channel feedback circuit can be coupled in parallel with a filter. FIG. 1K is a schematic diagram of an acoustic wave device 40 that includes a multi-channel feedback circuit coupled in parallel with a filter 42 according to an embodiment. The filter 42 is a ladder filter that includes series resonators and shunt resonators. The first filter 11 and/or the second filter 12 can be implemented in accordance with any suitable principles and advantages of the filter 42. The filter 42 can be a transmit filter in some instances, in which an input port IN is a transmit port and an output port OUT is an antenna port. In some other instances (not shown in FIG. 1K), the first feedback circuit 14 and/or the second feedback circuit 15' can be coupled to a node between two series resonators of the filter 42.

FIGS. 2A to 2C illustrate views of acoustic wave devices that include an acoustic obstacle between canceling circuits for different frequency bands according to certain embodiments. Any suitable principles and advantages of these acoustic wave devices can be implemented with each other and/or in combination with any of the other acoustic wave devices discussed herein.

FIG. 2A illustrates a first view 50 and a second view 55 of an acoustic wave device according to an embodiment. In FIG. 2A, the acoustic wave device includes an acoustic obstacle 52, IDT electrodes 53A and 53B of a first canceling circuit, IDT electrodes 53C and 53D of a second canceling circuit, and a piezoelectric substrate 54 on which the acoustic obstacle 52 and the IDT electrodes 53A to 53D are positioned. The acoustic obstacle 52 is disposed between IDT electrodes 53B and 53C to reduce and/or eliminate acoustic coupling between the first canceling circuit and the second canceling circuit. The acoustic obstacle 52 can be formed of the same material as an IDT electrode of a canceling circuit. The acoustic obstacle 52 can have any suitable shape. For instance, the acoustic obstacle 52 can have a zig-zag shape as illustrated. The acoustic obstacle 52 of FIG. 2A can scatter and/or diffract acoustic energy.

FIG. 2B illustrates a first view 60 and a second view 65 of an acoustic wave device according to an embodiment. In FIG. 2B, the acoustic wave device includes an acoustic obstacle 62 configured to absorb acoustic energy. The acoustic obstacle 62 can be formed of the same material as a cavity wall 64A and/or 64B of the acoustic wave device. The acoustic obstacle 62 can be a polymer pillar between IDT electrodes of different canceling circuits. The acoustic wave device illustrated in FIG. 2B also includes a roof 66 over the IDT electrodes 53A to 53D and the acoustic obstacle 62. The roof 66 can be separated by the acoustic obstacle 62 by a gap. The roof 66 can be formed of the same material(s) as the cavity walls 64A and 64B and the acoustic obstacle 62.

FIG. 2C illustrates a first view 70 and a second view 75 of an acoustic wave device according to another embodiment. This drawing illustrates that an acoustic obstacle 72 can include the features of the acoustic obstacle 52 of FIG. 2A combined with the acoustic obstacle 62 of FIG. 2B. The acoustic obstacle 72 can absorb and scatter acoustic energy.

Figure 3A:
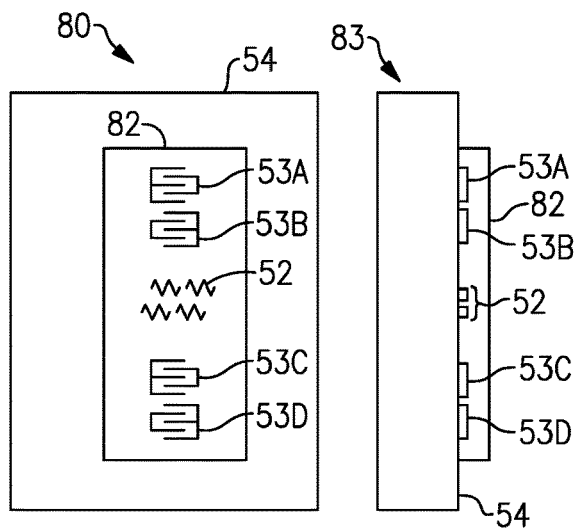
FIG. 3A illustrates views of an acoustic wave device according to an embodiment.
Figure 3B:
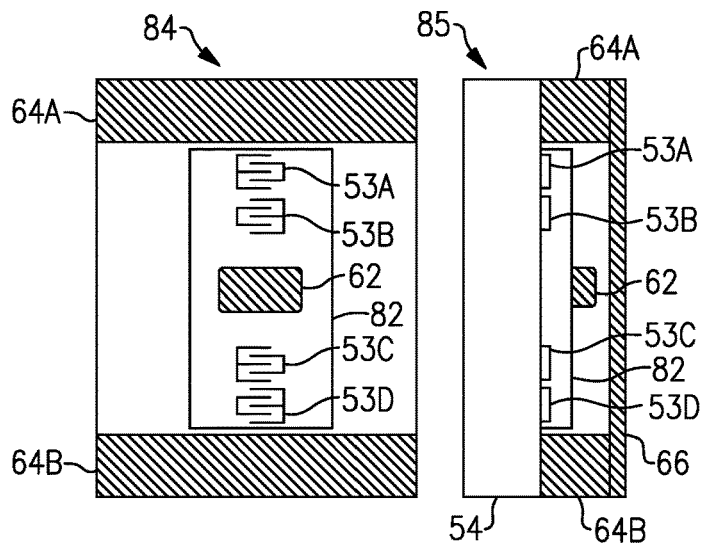
FIG. 3B illustrates views of another acoustic wave device according to an embodiment.
Figure 3C:
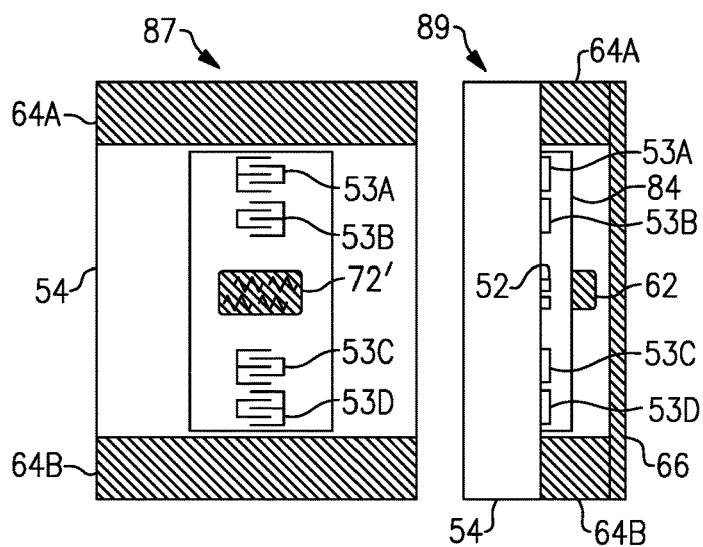
FIG. 3C illustrates views of another acoustic wave device according to an embodiment.
Figure 3D:
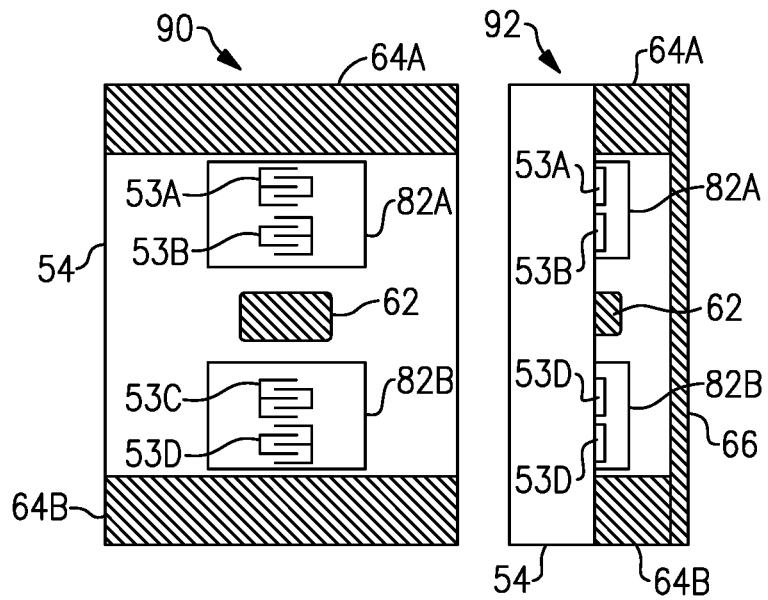
FIG. 3D illustrates views of another acoustic wave device according to an embodiment.
Figure 3E:
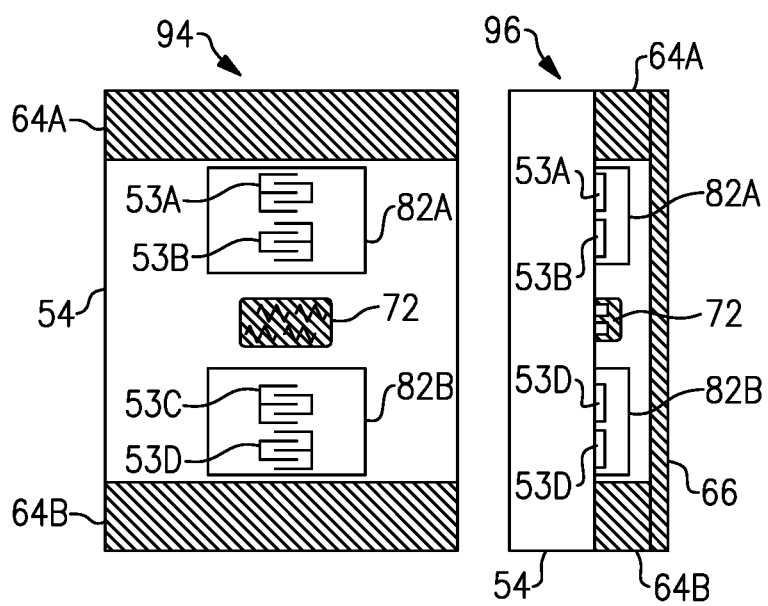
FIG. 3E illustrates views of another acoustic wave device according to an embodiment.
Figure 4:
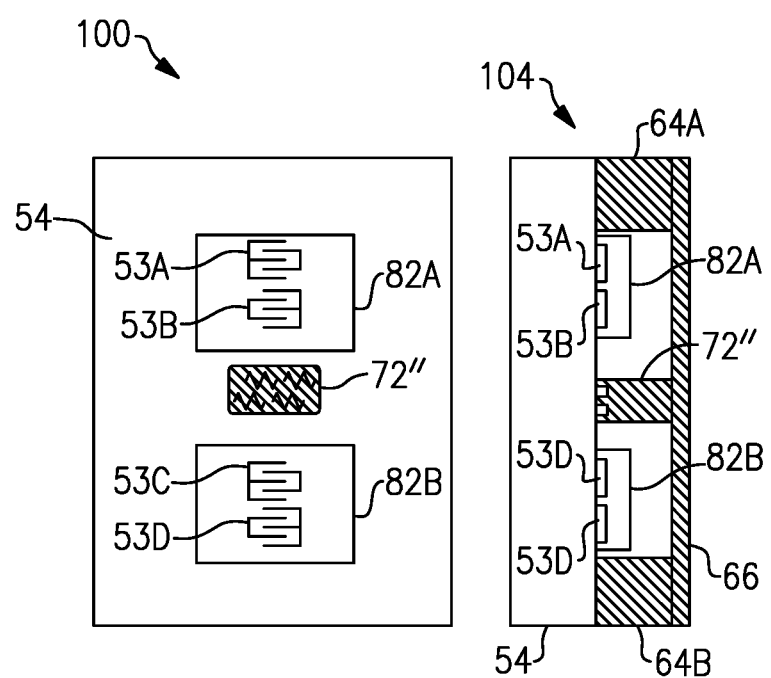
FIG. 4 illustrates views of another acoustic wave device according to an embodiment.

FIGS. 3A to 4 illustrate views of acoustic wave devices that include an acoustic obstacle between canceling circuits for different frequency bands according to certain embodiments. These acoustic wave devices include a dielectric layer, such as silicon dioxide layer, over IDT electrodes. The dielectric layer can be a temperature compensating layer. The temperature compensating layer can bring the temperature coefficient of frequency (TCF) of an acoustic wave device closer to zero. A TCF of close to zero is generally desirable. The temperature compensating layer can have a positive temperature coefficient of frequency. A non-dielectric temperature compensating layer can be implemented in place of a dielectric layer in any of the acoustic wave devices of FIG. 3A, 3B, 3C, or 4. Any suitable principles and advantages of these acoustic wave devices can be implemented with each other and/or in combination with any of the other acoustic wave devices discussed herein.

FIG. 3A illustrates a first view 80 and a second view 83 of an acoustic wave device according to an embodiment. The acoustic wave device of FIG. 3A is like the acoustic wave device of FIG. 2A except that the acoustic wave device of FIG. 3A includes a dielectric layer 82 over the IDT electrodes 53A to 53D and the acoustic obstacle 52. The dielectric layer 82 can be a silicon dioxide layer. FIG. 3A illustrates that an acoustic wave device can include an acoustic obstacle 52 that includes a pattern of the same material as an IDT electrode 53A to 53D and that the acoustic obstacle 52 can be covered by the dielectric layer 82. The acoustic obstacle 52 can scatter acoustic energy. This can reduce and/or eliminate acoustic coupling between a first canceling circuit that includes IDT electrodes 53A and 53B and a second canceling circuit that includes IDT electrodes 53C and 53D.

FIG. 3B illustrates a first view 84 and a second view 85 of an acoustic wave device according to an embodiment. The acoustic wave device of FIG. 3B is like the acoustic wave device of FIG. 2B except that the acoustic wave device of FIG. 3B includes a dielectric layer 82. The dielectric layer 82 is over the IDT electrodes 53A to 53D. In FIG. 3B, the dielectric layer 82 is disposed between the acoustic obstacle 62 and the piezoelectric substrate 54. As shown in FIG. 3B, the acoustic obstacle 62 can include a polymer pillar over the dielectric layer 82.

FIG. 3C illustrates a first view 87 and a second view 89 of an acoustic wave device according to an embodiment. The acoustic wave device of FIG. 3C includes an acoustic obstacle 72' that includes a combination of the acoustic obstacle 52 of FIG. 3A and the acoustic obstacle 62 of FIG. 3B. As shown in FIG. 3C, the acoustic obstacle 72' can include (1) patterned material that is the same material as an IDT electrode and covered by a dielectric layer 82, and (2) a polymer pillar over the dielectric layer 82.

FIG. 3D illustrates a first view 90 and a second view 92 of an acoustic wave device according to an embodiment. The acoustic wave device of FIG. 3D is like the acoustic wave device of FIG. 3B except that the acoustic wave device of FIG. 3D includes an acoustic obstacle 62 in contact with the piezoelectric substrate 54. In FIG. 3D, the dielectric layer 82 is not included between the acoustic obstacle 62 and the piezoelectric substrate 54. As shown in FIG. 3D, the acoustic obstacle 62 can include a polymer pillar disposed between IDT electrodes 53B and 53C of different canceling circuits that are covered by a dielectric layer 82. Without dielectric layer 82 under the polymer pillar, adhesion of the polymer pillar can be improved relative to a polymer pillar over a dielectric layer the in certain applications.

FIG. 3E illustrates a first view 94 and a second view 96 of an acoustic wave device according to another embodiment. The acoustic wave device of FIG. 3E includes an acoustic obstacle 72 that includes a combination of the acoustic obstacle 52 of FIG. 3A and the acoustic obstacle 62 of FIG. 3D. As shown in FIG. 3E, the acoustic obstacle 72 can include (1) patterned material that is the same material as an IDT electrode, and (2) a polymer pillar over the patterned material. Similar to the acoustic obstacle 62 of FIG. 3D, without a dielectric material under the polymer pillar, adhesion of the polymer pillar of the acoustic obstacle 72 can be improved relative to the acoustic obstacle 72' of FIG. 3C in certain applications.

While the acoustic obstacles of FIGS. 3A to 3E are separated from roof 66 of a cavity, the acoustic obstacle can be connected to the roof 66 of the cavity in certain instances. FIG. 4 illustrates a first view 100 and a second view 102 of an acoustic wave device in which an acoustic obstacle 72" is connected to a roof 66 of a cavity. The acoustic obstacle 72" can include a polymer pillar in contact with the roof 66 of the cavity. The acoustic wave device of FIG. 4 is like the acoustic wave device of FIG. 3E except that the acoustic obstacle 72 of FIG. 3E is separated from the cavity roof 66.

Acoustic wave devices can be manufactured in accordance with any suitable principles and advantages discussed herein. In such methods of manufacture, an acoustic obstacle can be formed between canceling circuits coupled to an acoustic wave filter such that the acoustic obstacle is arranged to reduce acoustic coupling between the canceling circuits associated with different frequency bands. In some such methods in which the canceling circuits include interdigital transducer electrodes, forming the acoustic obstacle can include patterning the same material as the interdigital transducer electrodes during a processing operation to form the interdigital transducer electrodes. Alternatively or additionally, in certain methods of manufacture, the acoustic obstacle can include a polymer and forming the acoustic obstacle can include forming the polymer of the acoustic obstacle while at least a portion of the cavity wall of the acoustic wave device is being formed of the same polymer. Methods of manufacture can further include electrically connecting the canceling circuits to the acoustic wave filter and a second acoustic wave filter and/or arranging the first acoustic wave filter and the second acoustic wave filter as a duplexer.

Moreover, radio frequency signals can be filtered using any suitable principles and advantages of the acoustic wave devices discussed herein. A method of filtering a radio frequency signal can include providing, using an acoustic obstacle, acoustic separation between a canceling circuit and another canceling circuit positioned in proximity to the canceling circuit. The method can also include applying a signal to an acoustic wave filter using the canceling circuit so as to attenuate a transmission characteristic of the acoustic wave filter within a frequency band outside the pass band of the acoustic wave filter. The method can also include filtering a radio frequency signal with the acoustic wave filter with the attenuated transmission characteristic.

FIG. 5A illustrates a portion 110 of an acoustic wave device with IDTs 53B and 53C of different canceling circuits without an acoustic obstacle disposed therebetween. FIG. 5B illustrates a portion of an acoustic wave device 112 with an acoustic obstacle 63 disposed between IDTs 53B and 53C of canceling circuits. The acoustic obstacle 52 of FIG. 5B includes patterned metal. The patterned metal is the same material as the IDT electrodes 53B and 53C in FIG. 5B. FIG. 5C is a graph of transmission characteristics of the acoustic wave devices of FIGS. 5A and 5B. FIG. 5C illustrates that the acoustic obstacle 52 can improve performance of the canceling circuits. For instance, this graph indicates that the acoustic obstacle 52 can cut out approximately 13.4 dB of signal.

Figure 6C:
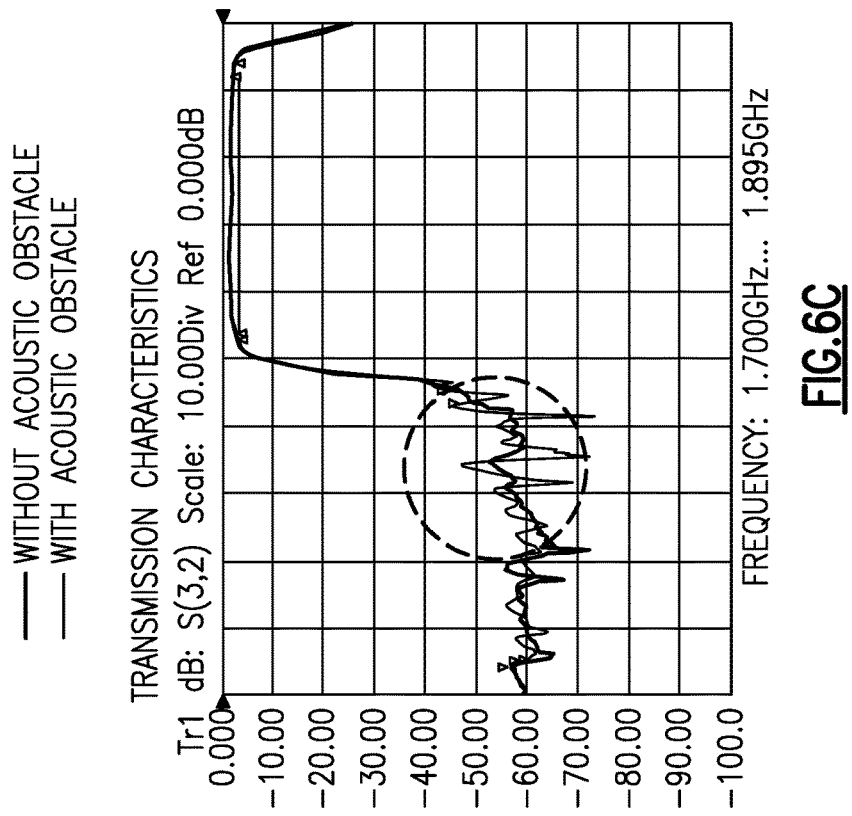
FIG. 6C is a graph corresponding to the acoustic wave devices of FIGS. 6A and 6B.
Figure 6A:
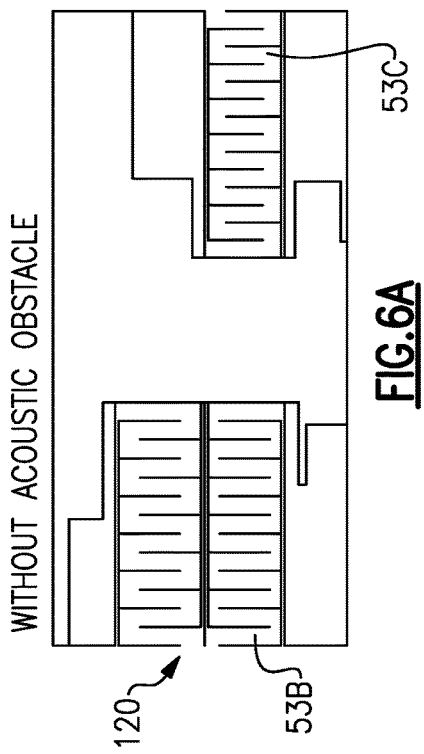
FIG. 6A illustrates a portion of an acoustic wave device with IDTs of different canceling circuits without an acoustic obstacle disposed therebetween.
Figure 6B:
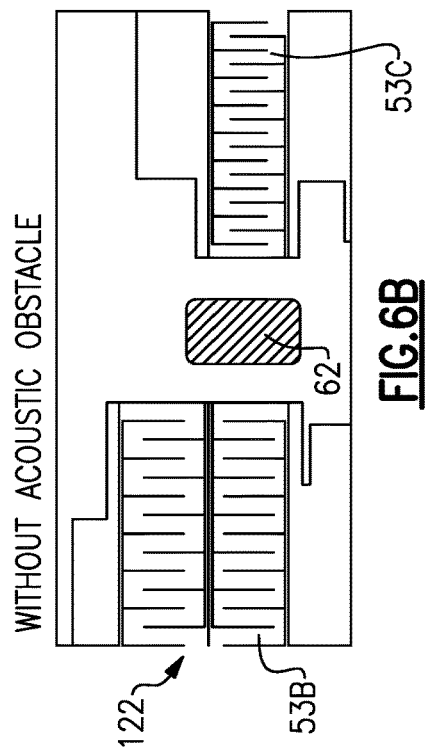
FIG. 6B illustrates a portion of an acoustic wave device with an acoustic obstacle disposed between IDTs of different canceling circuits.

FIG. 6A illustrates a portion 120 of an acoustic wave device test circuit to determine the acoustic communication between IDTs 53B and 53C without an acoustic obstacle disposed therebetween. FIG. 6B illustrates a portion 122 of an acoustic wave device test circuit with an acoustic obstacle 62 disposed between IDTs 53B and 53C. The acoustic obstacle 62 of FIG. 6B includes a pillar of acoustic absorbing material. The acoustic absorbing material is the same material as a cavity wall of the acoustic wave device in FIG. 6B. FIG. 6C is a graph of transmission characteristics of the acoustic wave devices of FIGS. 6A and 6B. FIG. 6C illustrates that the acoustic obstacle 62 can improve performance of the signal attenuation between IDTs 53B and 53C. This result shows that acoustic obstacles can prevent IDTs from communicating with each other by acoustic coupling. For instance, this graph indicates that acoustic obstacles can suppress a relatively strong spike in the frequency response of the acoustic wave device.

Figure 7A:
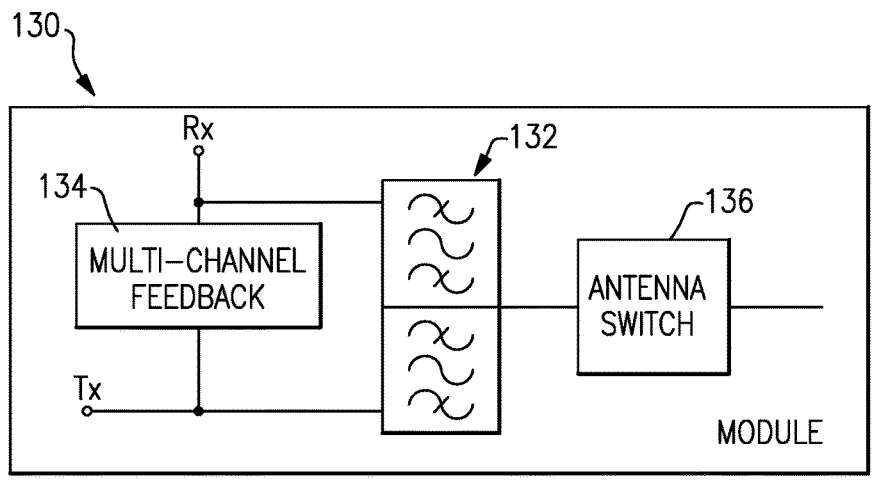
FIG. 7A is a schematic block diagram of a module that includes a duplexer, a multi-channel feedback circuit, and an antenna switch in accordance with one or more embodiments.
Figure 7B:
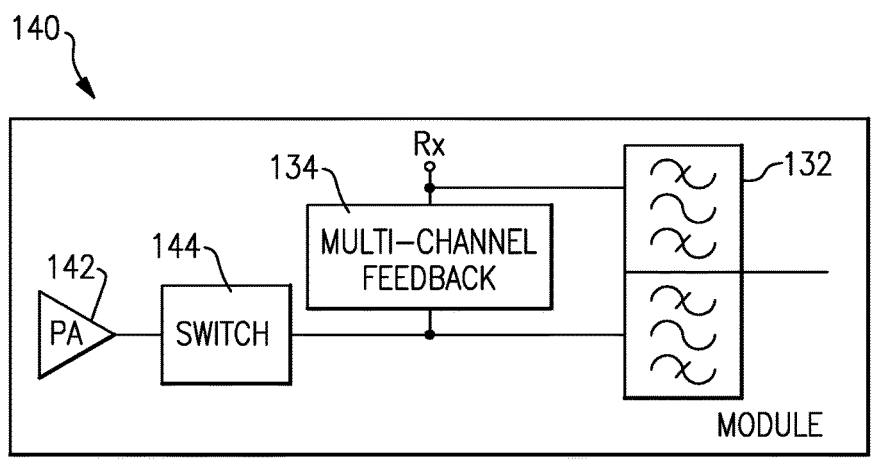
FIG. 7B is a schematic block diagram of a module that includes a power amplifier, a switch, a duplexer, and a multi-channel feedback circuit in accordance with one or more embodiments.
Figure 7C:
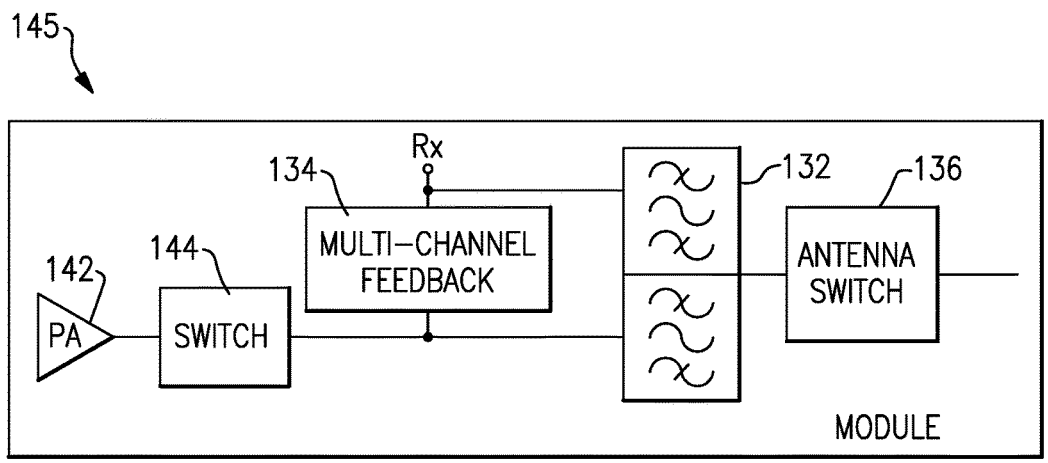
FIG. 7C is a schematic block diagram of a module that includes power amplifier, a switch, a duplexer, a multi-channel feedback circuit, and an antenna switch in accordance with one or more embodiments.

The multiplexers and/or filters discussed herein can be implemented in a variety of packaged modules. Some example packaged modules will now be discussed in which any suitable principles and advantages of the multi-channel feedback circuits that include an acoustic obstacle discussed herein can be implemented. FIGS. 7A, 7B, and 7C are schematic block diagrams of illustrative packaged modules according to certain embodiments.

FIG. 7A is a schematic block diagram of a module 130 that includes a duplexer 132, a multi-channel feedback circuit 134, and an antenna switch 136 in accordance with one or more embodiments. The module 130 can include a package that encloses the illustrated elements. The duplexer 132, the multi-channel feedback circuit 134, and the antenna switch 136 can be disposed on a common packaging substrate. The packaging substrate can be a laminate substrate, for example. The duplexer 132 can include any suitable number of acoustic wave resonators. For instance, the duplexer 132 can include one or more SAW resonators and/or one or more BAW resonators. As illustrated, the multi-channel feedback circuit 134 is coupled between a receive port Rx and a transmit port Tx of the duplexer 132. The multi-channel feedback circuit 134 can be implemented in accordance with any suitable principles and advantages discussed herein. For example, the multi-channel feedback circuit 134 can include any suitable acoustic obstacle discussed herein to reduce and/or eliminate acoustic coupling between canceling circuits. The antenna switch 136 can be a multi-throw radio frequency switch. The antenna switch 136 can selectively electrically couple a common node of the duplexer 232 to an antenna port of the module 130.

FIG. 7B is a schematic block diagram of a module 140 that includes a power amplifier 142, a switch 144, a duplexer 132, and a multi-channel feedback circuit 134 in accordance with one or more embodiments. The power amplifier 142 can amplify a radio frequency signal. The switch 144 can selectively electrically couple an output of the power amplifier 144 to a transmit port of the duplexer 132. The multi-channel feedback circuit 134 can be implemented in accordance with any suitable principles and advantages discussed herein.

FIG. 7C is a schematic block diagram of a module 150 that includes power amplifier 142, a switch 144, a duplexer 132, a multi-channel feedback circuit 134, and an antenna switch 136 in accordance with one or more embodiments. The module 150 is similar to the module 140 of FIG. 7B, except the module 150 additionally includes the antenna switch 136.

Figure 8:
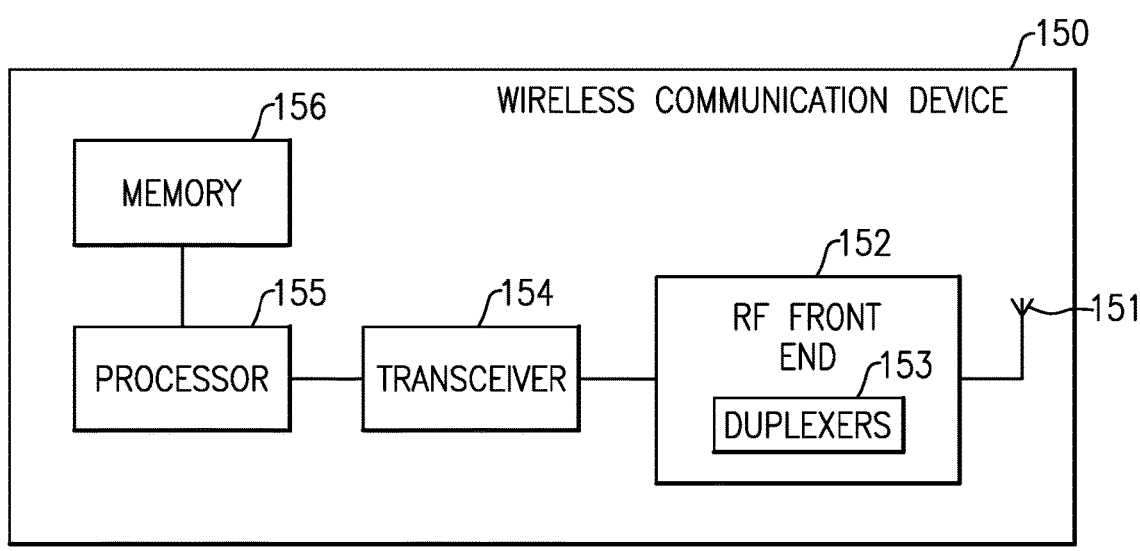
FIG. 8 is a schematic block diagram of a wireless communication device that includes duplexers in accordance with one or more embodiments.

FIG. 8 is a schematic block diagram of a wireless communication device 150 that includes duplexers 153 in accordance with one or more embodiments. The wireless communication device 150 can be any suitable wireless communication device. For instance, a wireless communication device 150 can be a mobile phone, such as a smart phone. As illustrated, the wireless communication device 150 includes an antenna 151, an RF front end 152, an RF transceiver 154, a processor 155, and a memory 156. The antenna 151 can transmit RF signals provided by the RF front end 152. The antenna 151 can provide received RF signals to the RF front end 152 for processing.

The RF front end 152 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end 152 can transmit and receive RF signals associated with any suitable communication standards. Any of the acoustic wave devices and/or multi-channel feedback circuits discussed herein can be implemented in the RF front end 152.

The RF transceiver 154 can provide RF signals to the RF front end 152 for amplification and/or other processing. The RF transceiver 154 can also process an RF signal provided by a low noise amplifier of the RF front end 152. The RF transceiver 154 is in communication with the processor 155. The processor 155 can be a baseband processor. The processor 155 can provide any suitable base band processing functions for the wireless communication device 150. The memory 156 can be accessed by the processor 155. The memory 156 can store any suitable data for the wireless communication device 150.

Any of the embodiments described above can be implemented in association with mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. For instance, while certain embodiments are discussed with reference to duplexers, any suitable principles and advantages can be implemented in association with diplexers and/or other frequency multiplexing circuits. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as semiconductor die and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a first canceling circuit arranged to cancel frequency components in a first frequency band;
a second canceling circuit arranged to cancel frequency components in a second frequency band;
an acoustic wave filter coupled to the first canceling circuit and the second canceling circuit;
an acoustic obstacle disposed between the first canceling circuit and the second canceling circuit; and
a cavity wall, the acoustic obstacle including the same material as the cavity wall.

2. The acoustic wave device of claim 1 further comprising a cavity roof over the acoustic obstacle, the cavity roof being separated from the acoustic obstacle by a gap.

3. The acoustic wave device of claim 1 wherein the same material of the acoustic obstacle and the cavity wall is a polymer.

4. The acoustic wave device of claim 1 further comprising a cavity roof over the acoustic obstacle, the cavity roof being in contact with the acoustic obstacle.

5. The acoustic wave device of claim 1 wherein the acoustic obstacle is positioned on a piezoelectric substrate.

6. The acoustic wave device of claim 1 wherein the acoustic wave filter includes a surface acoustic wave resonator and the first canceling circuit includes an interdigital transducer electrode.

7. The acoustic wave device of claim 6 wherein the acoustic obstacle and the interdigital transducer electrode each include the same material.

8. The acoustic wave device of claim 1 wherein the acoustic obstacle is configured to absorb acoustic energy and to scatter acoustic energy.

9. The acoustic wave device of claim 1 further comprising a second acoustic wave filter coupled to the first canceling circuit and the second canceling circuit, the acoustic wave filter being a transmit filter and the second acoustic wave filter being a receive filter.

10. The acoustic wave device of claim 1 wherein the acoustic obstacle is positioned on a silicon dioxide layer such that the silicon dioxide layer is positioned between the acoustic obstacle and a piezoelectric substrate.

11. A multiplexer comprising:
a transmit filter including first acoustic wave resonators;
a receive filter including second acoustic wave resonators, the receive filter and the transmit filter being coupled to each other at a common node;
a first canceling circuit coupled to the transmit filter and to the receive filter, the first canceling circuit including an interdigital transducer electrode;
a second canceling circuit coupled to the transmit filter and to the receive filter; and
an acoustic obstacle disposed between the first canceling circuit and the second canceling circuit, the acoustic obstacle and the interdigital transducer electrode each including the same material, and the acoustic obstacle further including a polymer.

12. The multiplexer of claim 11 wherein the multiplexer is arranged as a duplexer.

13. The multiplexer of claim 11 wherein the first canceling circuit is configured to attenuate a transmission characteristic of the receive filter at frequencies in a pass band of the transmit filter.

14. A surface acoustic wave device comprising:
a surface acoustic wave filter; and
a multi-channel feedback circuit coupled to the surface acoustic wave filter, the multi-channel feedback circuit including first interdigital transducer electrodes corresponding to a first channel, second interdigital transducer electrodes corresponding to a second channel, and an acoustic obstacle arranged to reduce acoustic coupling between the first interdigital transducer electrodes and the second interdigital transducer electrodes, the acoustic obstacle and the first interdigital transducer electrodes both including the same material, and the acoustic obstacle further including a polymer.

15. The surface acoustic wave device of claim 14 further comprising a second surface acoustic wave filter coupled to the multi-channel feedback circuit.

16. The surface acoustic wave device of claim 14 further comprising a cavity wall that includes the same polymer as the acoustic obstacle.

17. The surface acoustic wave device of claim 14 wherein a metallic portion of the acoustic obstacle has a zig-zag shape, the metallic portion including the same material as the first interdigital transducer electrodes.

18. A surface acoustic wave device comprising:
a surface acoustic wave filter;
a multi-channel feedback circuit coupled to the surface acoustic wave filter, the multi-channel feedback circuit including first interdigital transducer electrodes corresponding to a first channel, second interdigital transducer electrodes corresponding to a second channel, and an acoustic obstacle arranged to reduce acoustic coupling between the first interdigital transducer electrodes and the second interdigital transducer electrodes; and
a cavity wall, the acoustic obstacle including the same material as the cavity wall.

19. The surface acoustic wave device of claim 18 wherein the acoustic obstacle and the first interdigital transducer electrodes both include the same metallic material.

20. The surface acoustic wave device of claim 18 further comprising a second surface acoustic wave filter coupled to the multi-channel feedback circuit.

* * * * *